(12) United States Patent
Sekido

(10) Patent No.: US 7,153,145 B2
(45) Date of Patent: Dec. 26, 2006

(54) ELECTRIC JUNCTION BOX AND CONNECTION STRUCTURE OF TUNING FORK TERMINAL

(75) Inventor: Toshihisa Sekido, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 11/203,218

(22) Filed: Aug. 15, 2005

(65) Prior Publication Data

US 2006/0035492 A1  Feb. 16, 2006

(30) Foreign Application Priority Data

Aug. 16, 2004 (JP) .............................. 2004-236774
Aug. 23, 2004 (JP) .............................. 2004-242564

(51) Int. Cl.
*H01R 12/00* (2006.01)
(52) U.S. Cl. ...................................................... 439/76.2
(58) Field of Classification Search ............... 439/76.1, 439/76.2, 70–73, 331, 330, 266, 267, 751, 439/857, 850; 361/11
See application file for complete search history.

(56) References Cited

U.S. PATENT DOCUMENTS

| 6,062,916 | A  | * | 5/2000  | Gladd et al. .................. 439/751 |
| 6,402,530 | B1 | * | 6/2002  | Saito et al. .................. 439/76.2 |
| 6,540,531 | B1 | * | 4/2003  | Syed et al. ...................... 439/98 |
| 6,707,369 | B1 | * | 3/2004  | Morimoto et al. ........... 337/189 |
| 6,786,740 | B1 |   | 9/2004  | Ito |
| 6,851,956 | B1 |   | 2/2005  | Saka et al. |
| 6,891,463 | B1 | * | 5/2005  | Nagaoka ....................... 337/187 |
| 6,926,541 | B1 | * | 8/2005  | Takeuchi et al. ............ 439/76.2 |
| 2005/0048813 | A1 |   | 3/2005  | Shirota |

FOREIGN PATENT DOCUMENTS

| JP | 7-282884   | 10/1995 |
| JP | 9-102345   | 4/1997  |
| JP | 2001-016746 | 1/2001 |
| JP | 2001-025137 | 1/2001 |

OTHER PUBLICATIONS

English Language Abstract of JP 2001-016746.
English Language Abstract of JP 2001-025137.
English Language Abstract of JP 9-102345.
English Language Abstract of JP 7-282884.

* cited by examiner

*Primary Examiner*—Alexander Gilman
(74) *Attorney, Agent, or Firm*—Greenblum & Bernstein, P.L.C.

(57) ABSTRACT

An electric junction box that can accommodate various circuit patterns in accordance with a combination of a printed-circuit board and a case housing the printed-circuit board. Connection pins connected to conductors are provided in a projecting position at intervals along the peripheral edge of a printed-circuit board. An opening corresponding to the printed-circuit board is formed in a central region of the upper side of a case. Connector joints are positioned on the peripheral walls of the four sides of the case, and L-shaped terminals are provided at the same intervals as for the connection pins along the opening. Additionally, a connection structure of a tuning-fork terminal includes a tuning-fork terminal at the end portion of a conducting plate base bent vertically and having a press connection slot in the center of the vertical portion; and a tab-shaped mating terminal electrically connected to contact portions projecting from inner sides of the slot.

13 Claims, 14 Drawing Sheets

ELECTRIC JUNCTION BOX AND CONNECTION STRUCTURE OF TUNING FORK TERMINAL

CROSS-REFERENCE TO RELATED APPLICATIONS

The present disclosure relates to subject matter contained in priority Japanese Application Nos. 2004-242564, filed on Aug. 23, 2004, and 2004-236774, filed on Aug. 16, 2004, which are herein expressly incorporated by reference in their entireties.

BACKGROUND OF THE INVENTION

1. Field of the Invention

The present invention relates to an electric junction box that can be used to make a variety of circuit connections between electric wires connected to connectors via a printed-circuit board. In particular, the present invention relates to an electric junction box that is well-suited to use in an automobile. The present invention further relates to a connection structure of a tuning-fork terminal, particularly to a structure that secures the tuning-fork terminal to an electrically connected mating terminal.

2. Description of the Related Art

Conventionally, an electric junction box, having a configuration in which connectors are mounted on a printed-circuit board and electric wires connected to the connectors are mutually connected via a conductor of the printed-circuit board, has been provided, for example, in Japanese Patent Laid-open Publication No. 2001-25137.

The electric junction box of JP 2001-25137 is configured as follows. As FIG. 12A and FIG. 12B show, assembling part 1, which uses bus bars as circuit wiring material, has opening 1a formed at the central region of assembling part 1, and terminals 2 of the bus bars are provided in a condition protruding from the peripheral edge of opening 1a. Connectors 3 are attached to the peripheral edge of assembling part 1, and control circuit board 4 is mounted in opening 1a. Terminals 5, which are provided in a condition protruding from the peripheral edge of control circuit board 4, are soldered to terminals 2 of the bus bars of assembling part 1. Electric wires connected to connectors 3 are connected via bus bars to the conductor of control circuit board 4.

In the electric junction box disclosed in JP 2001-25137, since the bus bars of assembly part 1 are disposed between connectors 3 and the conductor of control circuit board 4, the configuration of the electric junction box becomes complicated and the size of the electric junction box becomes large. And, since terminals 5 of control circuit board 4 and terminals 2 of the bus bars are soldered to each other, there are problems such as that a soldering process is required.

A conventional method for preventing disengagement of electrically connected terminals includes providing a locking mechanism directly to terminals for fixation and to provide a terminal locking mechanism inside a cavity that houses a terminal.

One example of providing a locking mechanism to terminals themselves is a junction terminal as disclosed in Japanese Patent Laid-open Publication HEI 9-102345. In this example, junction terminal 101 has receptacles 101b at upper and lower ends of base 101a and projecting hook 101c inside receptacle 101b as shown in FIG. 18. Mating tab-shaped terminal 102 has square hole 102a near the end. When tab-shaped terminal 102 is inserted into receptacle 101b of junction terminal 101, hook 101c snaps and locks into square hole 102a as square hole 102a passes over hook 101c, thereby guarding against unwanted release of tab-shaped terminal 102 from junction terminal 101.

One example of providing a locking mechanism inside a terminal housing cavity is a male terminal locking mechanism in a connector housing as disclosed in Japanese Patent Laid-open Publication HEI 7-282884. In this example, lance 108 is set to project from inside cavity 107 of housing 106 that holds male terminal 105 as shown in FIG. 19. When male terminal 105 is inserted from opening 107a of cavity 107, lance 108 locks into convex portion 105a of male terminal 105, thereby preventing male terminal 5 from disengaging from housing 106.

JP 9-102345 represents an example of inserting and connecting the tab-shaped terminal into the receptacle; JP 7-282884 represents an example of fixing the terminal into the cavity of the receptacle. Neither of the prior art documents shows, however, an example of an insertion displacement connection, where a tab-shaped terminal is press-fitted to a tuning-fork terminal. The tuning-fork terminal, instead of a female terminal that requires bending press process, is widely used these days as a terminal electrically connected to the tab-shaped terminal. The tuning-fork terminal has a crimping slot notched to receive the mating tab-shaped terminal press-fitted from the flat end of the tuning-fork terminal. The mating tab-shaped terminal is press-fitted into the crimping slot of the tuning-fork terminal with high insertion force to prevent inadvertent release of the tab-shaped terminal in normal conditions. Considering that an excessive tensile force may be exerted, however, it is preferable to provide a mechanical interlocking structure, not relying on the insertion force alone.

SUMMARY OF THE INVENTION

The present invention is provided to address the above-described problems. An objective of the present invention is to enable a connection between the printed-circuit board and the connectors by using a variety of simple circuit configurations.

An aspect of the present invention provides an electric junction box including a printed-circuit board including a conductor formed on a circuit board, the printed-circuit board having a plurality of connection pins projecting outwardly therefrom at intervals along a peripheral edge of the printed-circuit board, the plurality of connection pins connected to the conductor of the printed-circuit board; and a case including an opening corresponding to the printed-circuit board in a central region of at least an upper surface or a lower surface of the case, the case including a plurality of peripheral walls and having a connector joint on at least one of the peripheral walls, the case having a plurality of L-shaped terminals provided along an inner peripheral edge of the opening at intervals substantially equal to the intervals between the plurality of connection pins; wherein, a first end of each the L-shaped terminal projects from the peripheral edge in the opening of the case; each the first end including a press connection slot formed therein, and a second end of each the L-shaped terminal projects outwardly from a terminal hole of one of the at least one connector joint; and wherein the printed-circuit board is positioned to close the opening in the case; and each the connection pin is inserted into and connected to a respective press-connecting slot of a respective L-shaped terminal.

A further aspect of the present invention provides a second printed-circuit board; wherein the case includes an opening on each of the upper and lower surfaces of the case, a plurality of the L-shaped terminals attached along an inner peripheral edge of each of the upper and lower openings, a first end of each L-shaped terminal connected to a connection pin of one of the printed-circuit boards and a second end of each L-shaped terminal projects outwardly from the terminal-hole of the at least one connector joint. Further, the connection pins are connected to the conductor of the printed-circuit board project upwardly from an upper side of the printed circuit board and downwardly from a lower side of the printed-circuit board, the case including a first case, the electric junction box further including a second case stacked vertically on the first case and sandwiching the printed-circuit board; wherein the connection pins projecting upwardly and downwardly from the upper and lower sides of the printed-circuit board are inserted into facing press-connecting slots of the L-shaped terminals of the vertically stacked cases.

Further, the connections may include three types of connection pins including first connection pins projecting upwardly from the upper side of the printed-circuit board and downwardly from the lower side of the printed-circuit board, second connection pins projecting upwardly, and third connection pins projecting downwardly. The connection pins connected to the conductor of the printed-circuit board are one of inserted into terminal holes formed on the conductor and soldered to the conductor and provided as press fit terminals press-fitted into the terminal holes. The conductor of the printed-circuit board is one of formed according to a circuit pattern, and first formed grid-shaped and then a circuit pattern is formed by removing necessary portions; and electric and/or electronic components are mounted on the printed-circuit board. The printed-circuit board has a square shape, and the opening in the case has a corresponding square shape, the square shaped printed-circuit board positioned to close the square shaped opening. The case includes four peripheral walls and a connector joint provided on each of the four peripheral walls. Additionally, each L-shaped terminal is attached along an inner peripheral edge of the opening. Further, the printed-circuit board includes connection pins projecting outwardly therefrom at intervals along the entire peripheral edge of the printed-circuit board, and the case includes corresponding L-shaped terminals provided along the entire inner peripheral edge of the opening. Each connection pin may include a latching tab projecting from a side of the insertion end of connection pin; the slot of the L-shaped terminal extends to a bend in the L-shaped terminal and the L-shaped terminal includes a latching portion cut into a base thereof and extending from the slot; and the connection pin is inserted into the press connection slot and the latching portion, locking the latching tab onto a rear side of the base. Further, the depth of the latching portion from the bend is smaller than the projection dimension of the latching tab of the connection pin. The projection dimension of the latching tab of the connection pin equals substantially one half the width in the projection direction of the connection pin.

A further aspect of the present invention provides a connection structure of a tuning-fork terminal including a tuning-fork terminal provided at an end portion of a conducting plate base bent vertically forming a vertical portion and having a press connection slot notched from the center of the vertical portion; and a tab-shaped mating terminal inserted into the slot of the tuning-fork terminal and electrically connected to contact portions projecting from inner sides of the slot and directed toward each other, wherein; the mating terminal includes a latching tab projecting from a side of the insertion end of the mating terminal; the slot of the tuning-fork terminal extends to a bend in the tuning-fork terminal and the tuning-fork terminal includes a latching portion cut into the conducting plate base and extending from the slot; and the mating terminal is inserted into the press connection slot and the latching portion, locking the latching tab onto a rear side of the conducting plate base. Further, the press connection slot may include a crimping slot.

A further aspect of the present invention provides a connection structure of a tuning-fork terminal including a tuning-fork terminal formed on a flat surface of a conducting plate base and having a press connection slot notched from an end thereof; and a tab-shaped mating terminal inserted into the slot of the tuning-fork terminal in the orthogonal direction and electrically connected to contact portions projecting from inner sides of the slot, wherein the mating terminal has a latching tab projecting to one side at the insertion end of the mating terminal; and the latching tab of the mating terminal is locked into a rear side of the conducting plate base of the tuning-fork terminal, engaging the tuning-fork terminal and the mating terminal. In a further aspect of the present invention, the conducting plate includes a bus bar housed in an electric connection box and including the tuning-fork terminal; and the mating terminal is one of a fuse terminal, a relay terminal, and a junction terminal mounted in the electric connection box, and a terminal connected to an external circuit.

In the configuration described above, when a connector connected to an electric wire in an automobile is fitted into a connector joint formed on a peripheral wall of the case, the terminal in the connector connected to an electric wire is connected to the terminal projected in the connector joint, thereby making it possible to connect electric wires via the circuit of the printed-circuit board. Since electric wires are connected to the circuit of the printed-circuit board via L-shaped terminal material only, without the use of bus bars for an internal circuit joining the electric wires, the configuration becomes simple, the number of components becomes smaller, and the soldering process disclosed in JP 2001-25137, in which terminals of the bus bars and the terminals of the circuit board are soldered to each other, becomes unnecessary, thereby making it possible to produce an electric junction box cost-effectively.

Furthermore, one end of each of the terminals with respective press-connecting slots is located along the peripheral edge of the case opening, while connection pins are connected to conductors along the peripheral edge of the printed-circuit board at the same intervals as for the terminals. This configuration collectively connects the terminals of the case and the connection pins of the printed-circuit board, thus making it possible to easily connect the printed-circuit board and the terminals within the case when the printed-circuit board is positioned in such a way as to close the opening. Moreover, because only the printed-circuit board needs to be replaced to accommodate various circuit patterns, it is possible to share the use of the same connection pins and the case, and flexibly accommodate changed circuits.

It is preferable to attach a cover on the side opposite to the connection pin-projecting side of the printed-circuit board. By doing so, the conductor of the printed-circuit board can be protected. And, when the shape of the peripheral edge of the cover is made the same as the shape of the opening provided on the cover, the opening of the case can be completely closed by the cover.

In the configuration described above, since two printed-circuit boards are used, it is possible to accommodate more complicated circuit patterns. When only one printed-circuit board is used, one opening on either the upper or lower surface of the case can be closed by covering the opening with a cover; thus, the case can be used in both an electric junction box using only one printed-circuit board and an electric junction box using two printed-circuit boards.

In the configuration described above, by vertically stacking the cases, it is possible to accommodate more complicated circuit patterns and to connect more electric wires in a variety of circuit configurations by using the same cases. In other words, when the number of connectors connected to electric wires is four or less, it is possible to connect electric wires by fitting the connectors into the connector joints of one case. However, when the number of connectors connected to electric wires is five or more, it is no longer possible to fit all the connectors in the connector joints of one case. Therefore, by vertically stacking the same cases and connecting the L-shaped terminals in the stacked cases to the connection pins connected to the conductor of the printed-circuit board, more connector joints are provided, thereby making it possible to fit all connectors into connector joints even when the number of connectors is five or more. Since the stacked cases are the same cases, the cases can be used both when the stacking is of single layer and when the stacking is of a plurality of layers. The stacking of the cases is not limited to two-layer. Cases and printed-circuit boards can be stacked alternatively to form a stacking of three or more layers.

The connection pins include three types of connection pins, which are the first connection pins projecting outwardly from both sides of the printed-circuit board, the second connection pins projecting upwardly and the third connection pins projecting downwardly. In the configuration described above, the first connection pins are used to connect the conductor of the printed-circuit board to the L-shaped terminals in the two cases on the upper and lower levels. The second connection pins are used to connect the conductor of the printed-circuit board to the L-shaped terminals in the case on the upper level. The third connection pins are used to connect the conductor of the printed-circuit board to the L-shaped terminals in the case on the lower level. By using necessary connection pins, a variety of circuit patterns can be formed.

The connection pins connected to the conductor of the printed-circuit board are inserted into terminal holes formed on the conductor and soldered to the conductor; or the connection pins are used as press-fit terminals and are press-fitted into the terminal holes. In the configuration described above, connection pins can be easily connected to the conductor of the printed-circuit board by soldering or press-fitting.

In the configuration, in which the conductor of a printed-circuit board is first formed cross-shaped, and then a circuit pattern is formed by removing necessary portions such as the crossing point of the conductor, the printed-circuit board can be used for a variety of circuit patterns. And, since electric and/or electronic components are mounted on the printed-circuit board, the printed-circuit board is not only for connecting electric wires, but can also have other functions such as the function as a relay-based switch.

As described above, according to the present invention, a connector that connects to a wired terminal provided in an automobile fits into a connector joint that is provided on a peripheral wall of the case. This configuration connects terminals within the connector that are connected to electric wires and terminals that project into the connector joint, thereby connecting the electric wires via the printed-circuit board conductor. Because the printed-circuit board is used as an internal circuit connecting electric wires "w" instead of a bus bar made of a conductive metal plate, it is possible to accommodate complex circuit patterns and reduce the size of an electric junction box.

Furthermore, one end of each of the terminals with respective press-connecting slots is located along the peripheral edge of the case opening, while connection pins are connected to conductors along the peripheral edge of the printed-circuit board at the same intervals as for the terminals. This configuration collectively connects the terminals of the case and the connection pins of the printed-circuit board, thus making it possible to easily connect the printed-circuit board and the terminals within the case when the printed-circuit board is positioned in such a way as to close the opening. Moreover, because only the printed-circuit board needs to be replaced to accommodate various circuit patterns, it is possible to share the use of the same connection pins and the case, and flexibly accommodate changed circuits.

Another purpose of the present invention is to allow easy locking of a tuning-fork terminal and a mating tab-shaped terminal.

According to the connection structure, the difference in shape from a conventional terminal is merely that the tuning-fork terminal has a long bent slot and that the mating tab-shaped terminal has the end projecting to one direction. As described above, a simple locking structure utilizing connecting portions of the tuning-fork terminal and the tab-shaped terminal is capable of preventing disengagement of the terminals. Furthermore, the structure provides high workability since locking and connecting the terminals can be performed together and since unlocking is easy when the terminals are disconnected.

It is desirable that the depth of the notch from the bend of the latching portion is less than the length of the projection of the latching tab of the mating terminal. Having the notch depth of the latching hole less than the projection of the latching tab of the mating terminal secures the latching tab of the mating terminal to the rear side of the bus bar base where the mating terminal is set, as long as the contact portions of the tuning-fork terminal remain in contact with the mating terminal, thus preventing the lock from being released easily with little vibration.

The present invention further provides a tuning-fork terminal formed on the same flat surface of a conducting plate base and having a crimping slot notched from the end; and a tab-shaped mating terminal inserted into the slot of the tuning-fork terminal in the orthogonal direction and electrically connected to contact portions protruding from inner sides of the slot. The mating terminal has a latching tab projecting to one side at the insertion end. The present invention provides a connection structure of the tuning-fork terminal where locking the latching tab of the mating terminal into the rear side of the base of the tuning-fork terminal engages the tuning-fork terminal and the mating terminal.

As described above, forming the contact portions of the slot on the same flat surface of the conducting plate base prevents deformation of the tuning-fork terminal. The form further ensures prevention of connection failure due to deformation and vibration, since the locking and contact portions are closely located when the mating tab-shaped terminal and the tuning-fork terminal are interlocked.

In the embodiments of the present invention, making the lower surface of the latching tab tapered allows easy insertion into the slot. Both the upper and lower surfaces of the latching tab may also be tapered toward the end.

According to the present invention, the locking mechanism uses a connection structure of the terminal itself as described above, requiring no complex locking mechanism installed on one of a housing and a case that houses the terminal and simplifying a shape of the terminal that includes the locking mechanism. The simple and inexpensive structure is capable of preventing disengagement of the terminals.

BRIEF DESCRIPTION OF THE DRAWINGS

The above, and other objects, features, and advantages of the present invention will be made apparent from the following description of the preferred embodiments, given as nonlimiting examples, with reference to the accompanying drawings in which.

DETAILED DESCRIPTION OF PREFERRED EMBODIMENTS

Figure 1:
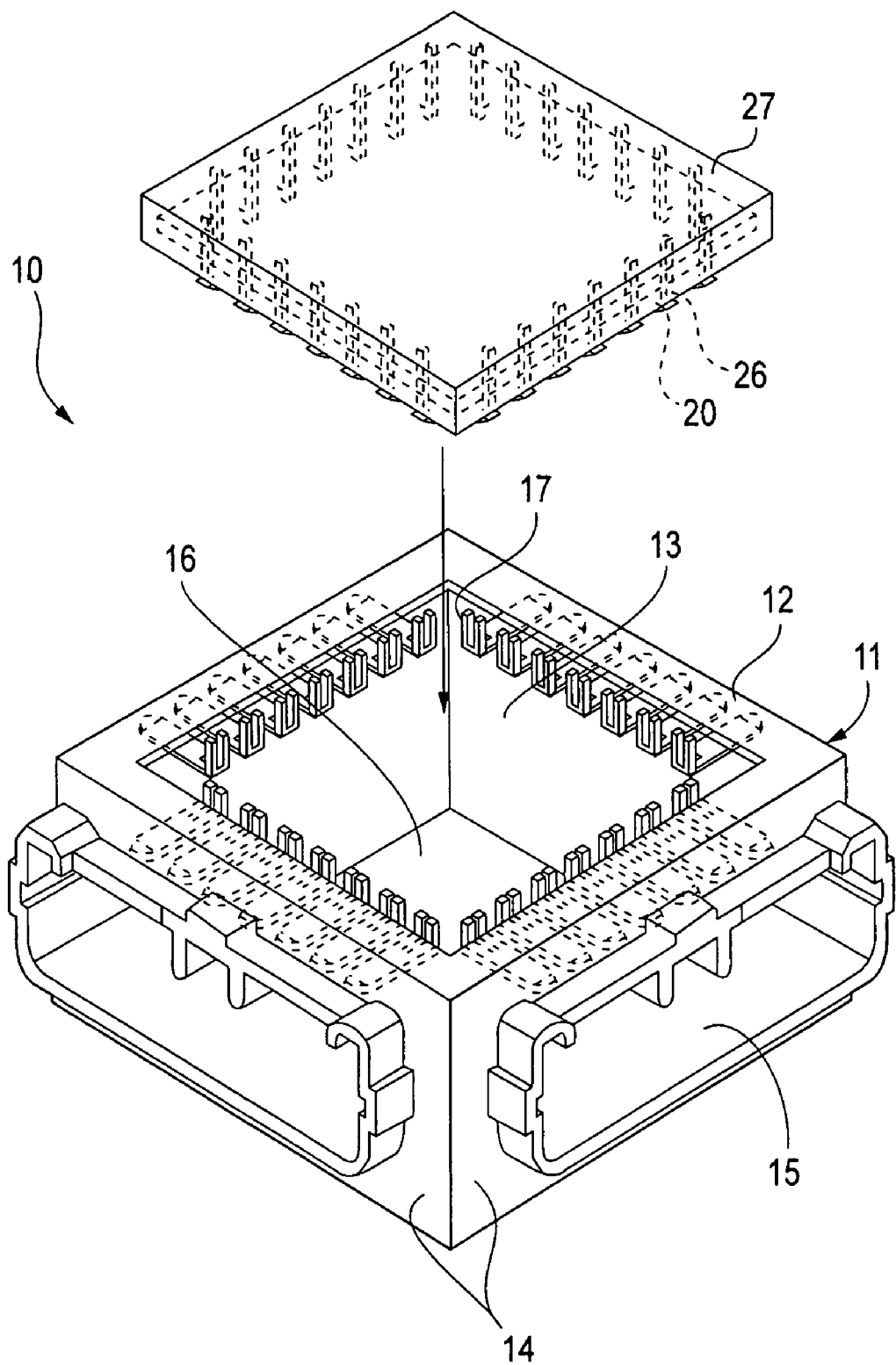
FIG. 1 is an exploded perspective view of an electric junction box according to a first embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The following describes preferred embodiments of the present invention with reference to the drawings. FIGS. 1 through 7 illustrate a first embodiment of the present invention. Electric junction box 10 includes printed-circuit board 20 within case 11, connecting a plurality of electric wires "w" via the printed-circuit board.

Case 11 is a rectangular-shaped box, having square-shaped opening 13 provided on upper side 12. Case 11 also has one connector joint 15 projecting from each of the four outer sides of peripheral walls 14. Bottom wall 15a of connector joint 15 has terminal holes 15b that are equally spaced in a single row. Alternatively, the terminal holes 15b may be provided in other predetermined spacing arrangements. In the present embodiment, lower side 16 of case 11 is a closed side.

Figure 3:
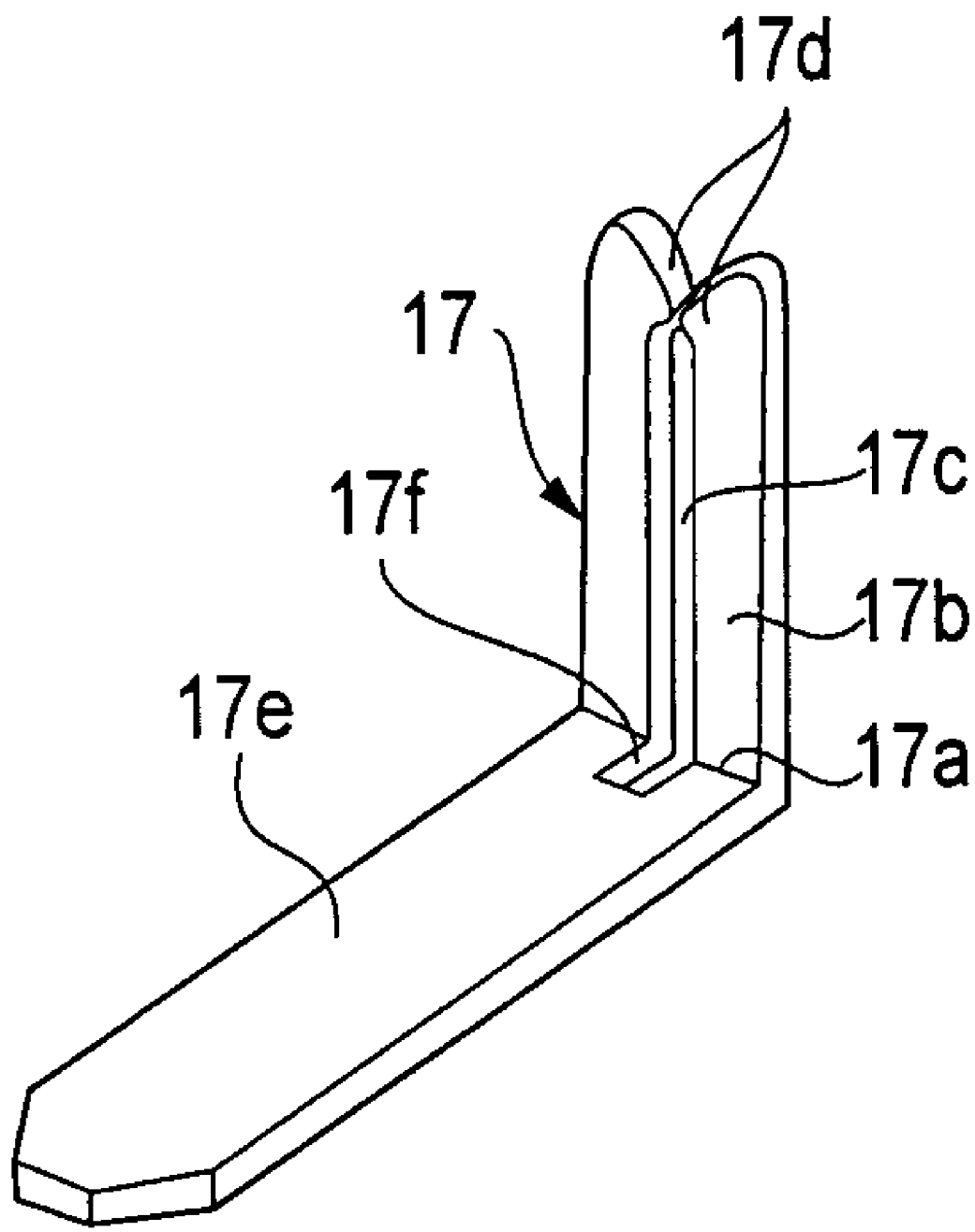
FIG. 3 is a perspective view of a terminal attached to the case of FIG. 2A.

A plurality of terminals 17 are housed within case 11. As shown in FIG. 3, terminal 17 is L-shaped, bending at a substantially 90 degree angle at bending portion 17a in a central region in the length direction. Press-connecting slot 17c is formed by cutting out a portion from the tip center of a first end 17b through bending portion 17a. Contact portions 17d are provided in a projecting manner, with the two inner sides of press-connecting slot 17c facing each other. A second end 17e has locking hole 17f that is cut out from bending portion 17a and joins with press-connecting slot 17c, with a male tab shaped tip.

Figure 2A:
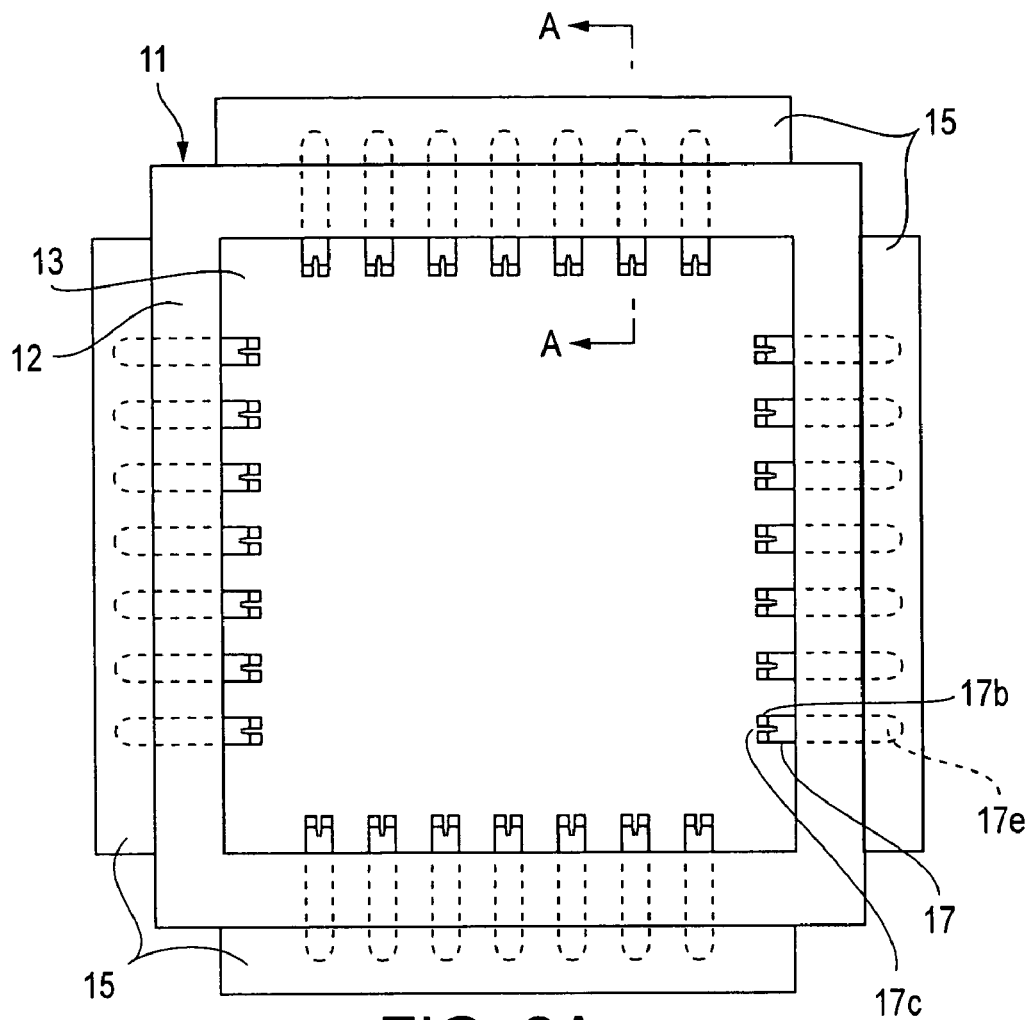
FIG. 2A shows a top plan view of a case provided in the electric junction box of FIG. 1.
Figure 2B:
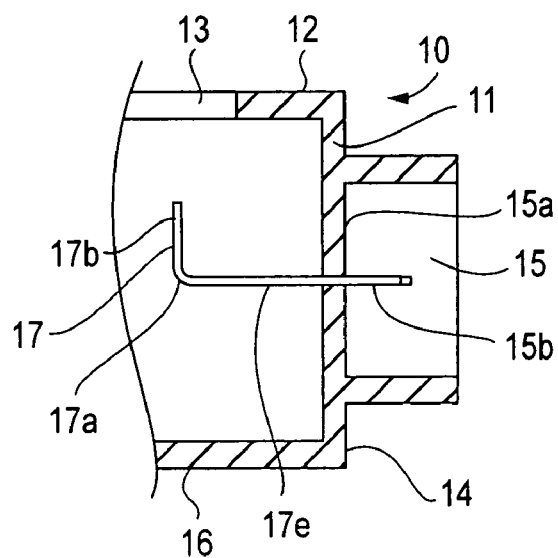
FIG. 2B shows a cross-sectional view through A—A line of the case of FIG. 2A.

The second end 17e of terminal 17 passes through terminal hole 15b that is provided on bottom wall 15a of connector joint 15 of case 11. As shown in FIG. 2B, the second end 17e is fixed into connector joint 15 in a projecting manner. The first end 17b equipped with press-connecting slot 17c projects upward along a peripheral edge of opening 13 of upper side 12 of case 11 as shown in FIG. 2A. In addition, terminal 17 and case 11 may be molded integrally.

Figure 4A:
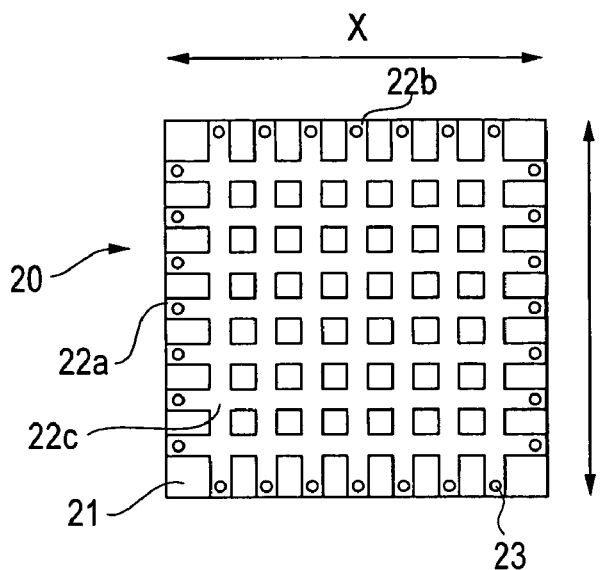
FIG. 4A is a top plan view of a printed-circuit board provided in the electric junction box of FIG. 1, before unnecessary portions are removed from a conductor.
Figure 4B:
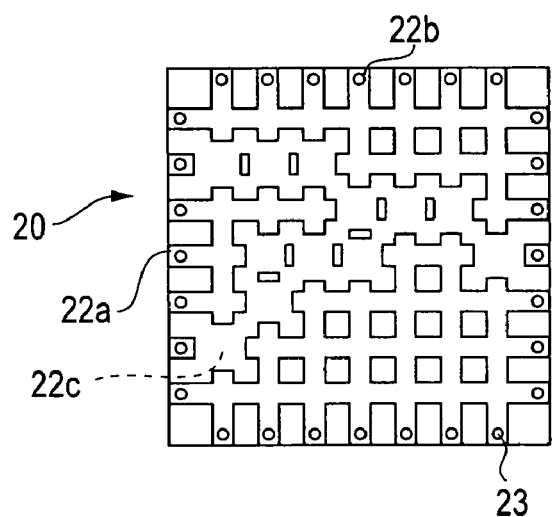
FIG. 4B is a top plan view of the printed-circuit board provided in the electric junction box of FIG. 1, after unnecessary portions are removed from the conductor.
Figure 4C:
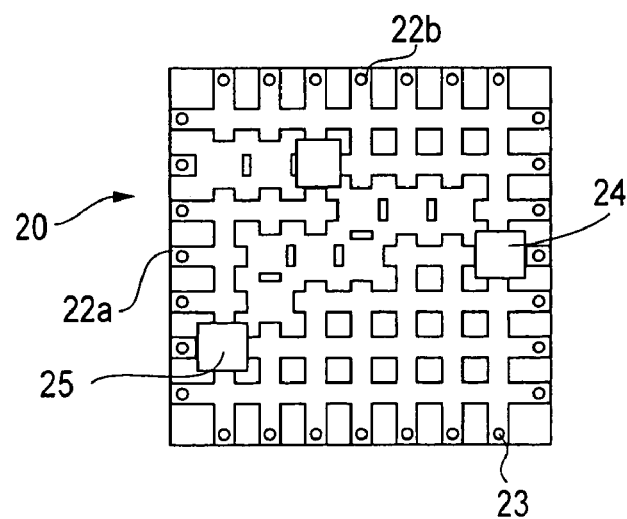
FIG. 4C is a top plan view of the printed-circuit board provided in the electric junction box of FIG. 1, equipped with electric and electronic components.

Printed-circuit board 20 housed within case 11, as shown in FIGS. 4A–4C, includes conductors 22a that extend in lateral direction X on one side of square-shaped insulating plate 21, equally spaced in longitudinal direction Y. Printed-circuit board 20 also includes conductors 22b that extend in lateral direction Y, equally spaced in longitudinal direction X, thus forming a grid-like structure. In addition, lead-through holes are provided along the entire peripheral edge of printed-circuit board 20, directly connecting to insulating plate 21 and conductor 22, thereby forming terminal holes 23 through which pass connection pins 26. Terminal holes 23 are positioned at the same intervals as for terminals 17 housed within case 11. Connection pins 26, described below, pass through terminal holes 23 for attachment, thereby positioning terminal 17 within case 11 at the same intervals as for connection pins 26.

Printed-circuit board 20, as shown in FIG. 4B, forms a predetermined circuit pattern by removing predetermined crossing portion 22c where conductors 22a and 22b cross. As shown in FIG. 4C, electric components, such as board relay 24, and electronic components, such as semiconductor relay 25, are mounted at predetermined locations of conductor 22. Alternatively, portions may be removed at a predetermined portion from the conductor other than the crossing portion.

Figure 5:
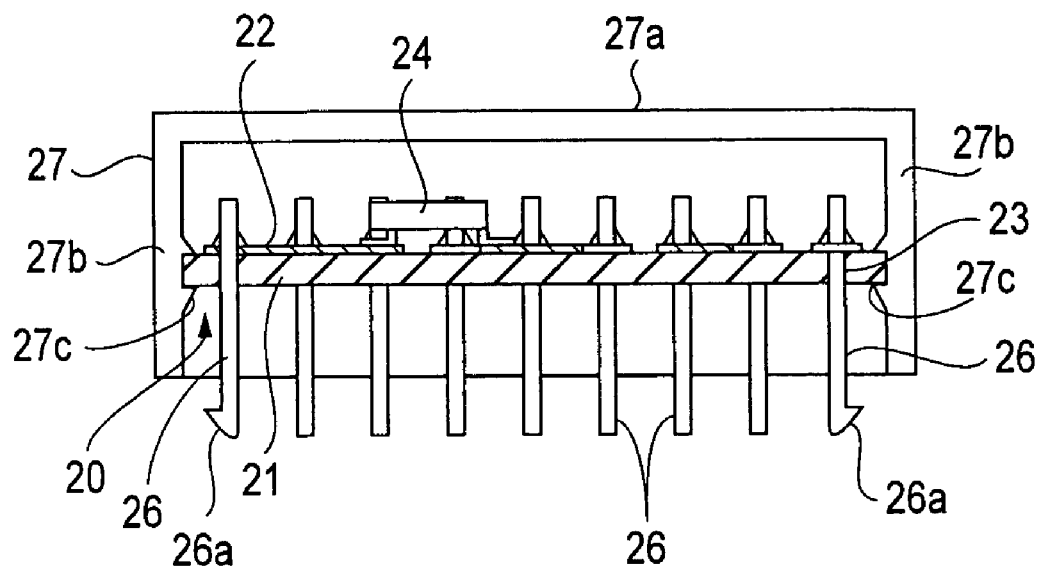
FIG. 5 is a cross-sectional view of the printed-circuit board provided in the electric junction box of FIG. 1, with a cover attached.

Connection pins 26 that pass through terminal holes 23 of printed-circuit board 20 are soldered to conductor 22. Connection pin 26 has, at its insertion-side tip, locking claw 26a that is provided at a substantially 90-degree angle relative to an axial direction. Connection pins 26 are passed through terminal holes 23 provided along the entire peripheral edge of printed-circuit board 20 and are soldered to conductors 22 respectively. With connection pin 26 soldered to conductor 22 of printed-circuit board 20, locking claw 26a that is provided on the insertion-side tip of connection pin 26 projects toward the outer peripheral side of printed-circuit board 20 as shown in FIG. 5.

The upper side of printed-circuit board 20 is covered with cover 27, the upper side having conductor 22 of printed-circuit board 20. Cover 27 is made of upper wall 27a, which has the same shape as that of opening 13 provided on the upper side of case 11, and of peripheral wall 27b that projects downward from the lower side of upper wall 27a along the peripheral edge, with the bottom side left open. The insertion-side tip of connection pin 26 attached to printed-circuit board 20 projects through the bottom opening. On the inner surface of peripheral wall 27b of cover 27, locking grooves 27c are provided in a horizontal direction. The peripheral portion of printed-circuit board 20 is inserted into and locked at locking groove 27c, thereby firmly attaching cover 27 to printed-circuit board 20.

Figure 6:
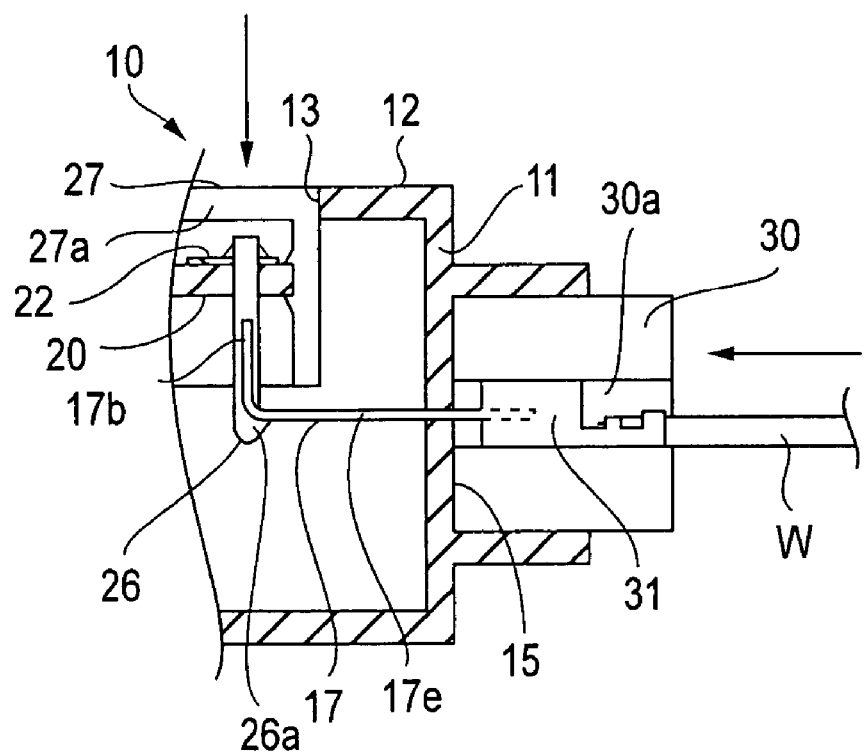
FIG. 6 is a cross-sectional view of the electric junction box of FIG. 1 to which a connector is connected.
Figure 7:
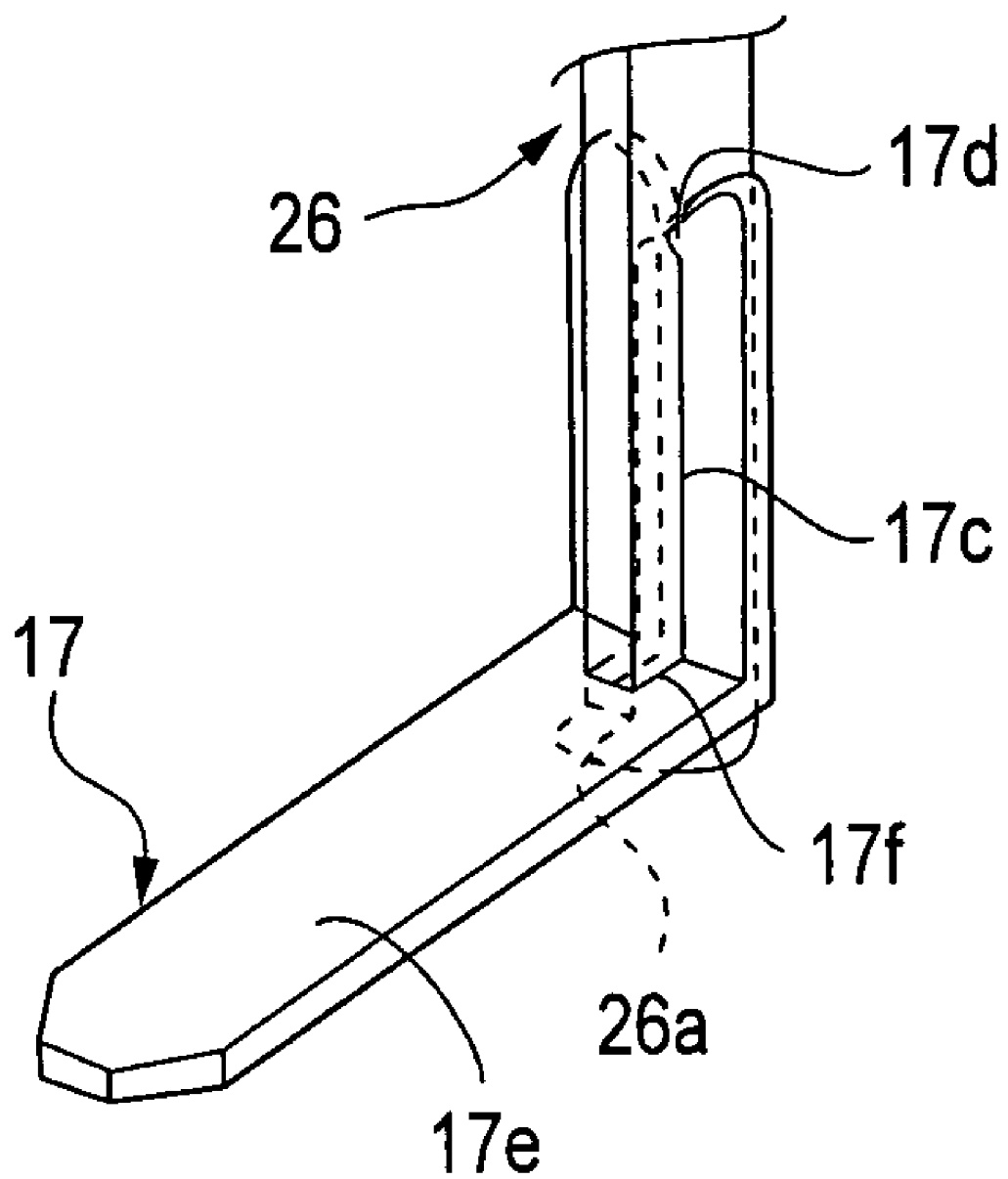
FIG. 7 is a perspective view of a terminal of the electric junction box of FIG. 1 to which a connection pin is connected.

Printed-circuit board 20 having cover 27 attached is inserted from opening 13 of case 11 into case 11. Connection pins 26 attached to printed-circuit board 20 are inserted into press-connecting slot 17c of terminals 17 housed within case 11. When printed-circuit board 20 is inserted to a predetermined position of case 11, as shown in FIGS. 6 and 7, a pair of contact portions 17d of terminal 17 are press-fitted to connection pins 26. Locking claws 26a of connection pins 26 are locked on the rear side of the second end 17e of terminal 17. Moreover, opening 13 of case 11 is closed by upper wall 27a of cover 27 attached to printed-circuit board 20.

Connector 30 is fit into connector joint 15 provided on peripheral wall 14 of case 11. Female terminal 31 of wire "w" terminal housed in terminal receptacle 30a of connector 30 connects to the second end 17e of terminal 17 that projects into connector joint 15. This configuration connects a plurality of electric wires "w" via terminal 17, connection pins 26, and conductor 22 of printed-circuit board 20.

According to the above-described embodiment, because printed-circuit board 20 is used as an internal circuit connecting electric wires "w" without using a bus bar made of a conductive metal plate, it is possible to accommodate a complex circuit pattern and reduce the size of an electric junction box. Furthermore, one end 17b of terminal 17 is positioned along the peripheral edge of opening 13 of case 11, and connection pins 26 are connected to conductors 22 along the peripheral edge of printed-circuit board 20 at the same intervals as for terminals 17. This configuration collectively unites terminals 17 of case 11 and connection pins 26 of printed-circuit board 20 when printed-circuit board 20 is positioned in such a way as to close opening 13. Moreover, when electric junction box 10 of the present invention is used for a different type or grade of vehicle, or when changes are made to circuits, only printed-circuit board 20 needs to be replaced, thus enabling the shared use of the same connection pins 26 attached to printed-circuit board 20, case 11 and terminals 17 attached to case 11.

Figure 8:
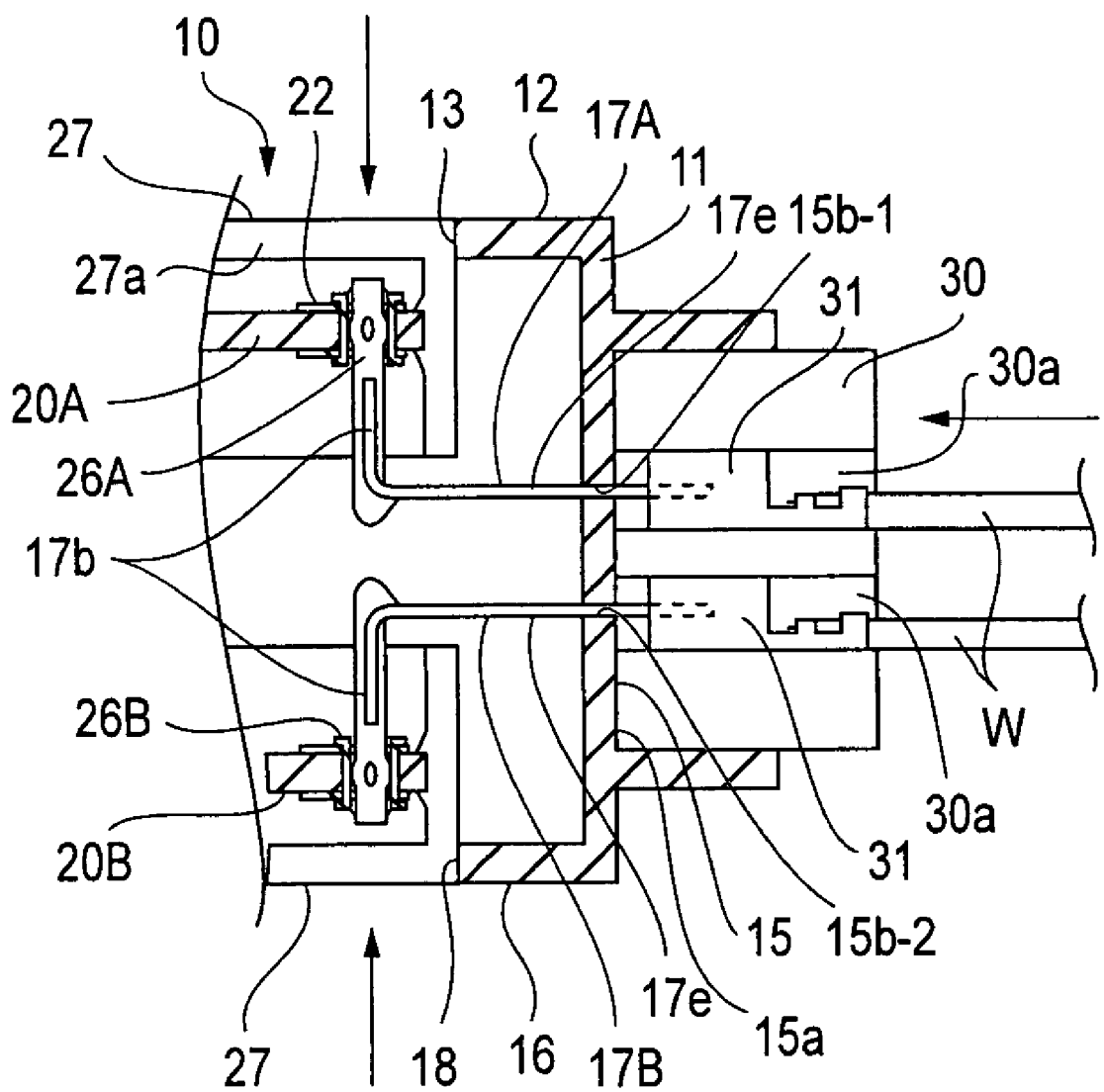
FIG. 8 is a cross-sectional view of an electric junction box according to a second embodiment of the present invention.
Figure 9:
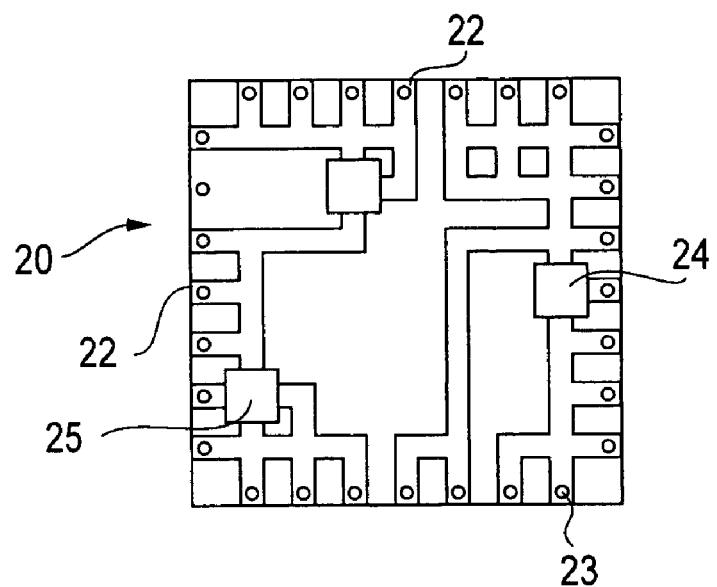
FIG. 9 is a top plan view of the printed-circuit board provided in the electric junction box of FIG. 8.
Figure 10:
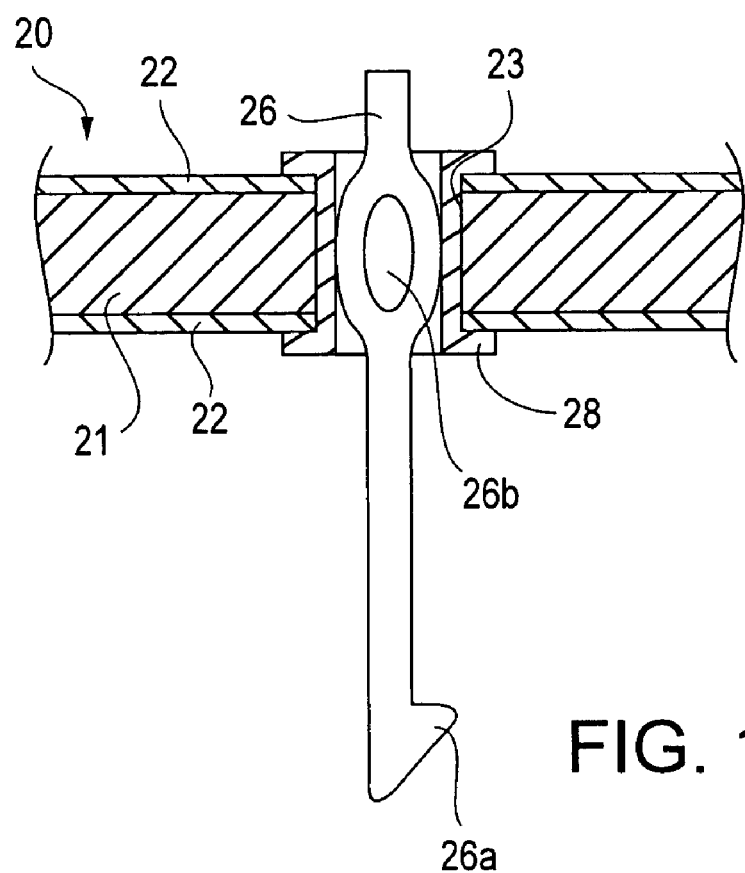
FIG. 10 is a cross-sectional view of the printed-circuit board provided in the electric junction box of FIG. 8 whereby a connection pin is connected to one of the conductors, with the relevant part enlarged.

FIGS. 8 through 10 illustrate a second embodiment of the present invention. According to the second embodiment, opening 13 is provided on the upper side 12 of case 11, and opening 18 is provided on the lower side 16 of case 11, thereby inserting printed-circuit board 20 from the upper and lower sides into case 11.

Bottom wall 15a of connector joint 15 of case 11, as shown in FIG. 8, has terminal holes 15b in vertical pairs. Terminals 17A attached to terminal holes 15b-1 on the upper level have one end 17b projecting upward; terminals 17B attached to terminal holes 15b-2 on the lower level have one end 17b projecting downward. Connection pins 26A that are attached to printed-circuit board 20A inserted into case 11 are inserted into press-connecting slot 17c of terminal 17A from above, thereby connecting terminals 17A and connection pins 26A; connection pins 26B that are attached to printed-circuit board 20B inserted into case 11 are inserted into press-connecting slot 17c of terminal 17B from below, thereby connecting terminals 17B and connection pins 26B. Connector 30 includes terminal receptacles 30a in vertical pairs, corresponding to terminals 17 attached in vertical pairs.

On printed-circuit board 20 according to the present embodiment, unlike the first embodiment, conductor 22 is formed in accordance with a predetermined circuit pattern as shown in FIG. 9. A special printed-circuit board is thus provided for each specific circuit pattern. Furthermore, as shown in FIG. 10, connection pins 26 are press fitted with printed-circuit board 20 as press-fit terminals. In other words, a copper coating is applied to the entire inner peripheral surface of terminal hole 23 of printed-circuit board 20 and to the surface of printed-circuit board 20, while a tin coating or a solder coating is applied to the copper coated surface to form conductive layer 28, thereby connecting conductive layer 28 and conductor 22. Connection pin 26 has press-fit portion 26b that is stamped to a thin plate. Press-fit portion 26 is press-fitted into terminal hole 23 of printed-circuit board 20 to establish connection with conductor 22.

According to the above embodiment, because case 11 houses printed-circuit board 20 in two layers, more complex circuit patterns can be accommodated while more electric wires "w" can be connected. Moreover, because connection pins 26 are used as press-fit terminals, connection pins 26 can be easily connected by pressing them into terminal holes 23 of printed-circuit board 20. Other components and effects are identical to those described in the first embodiment, and their illustration is therefore omitted with the same numbers assigned.

Figure 11:
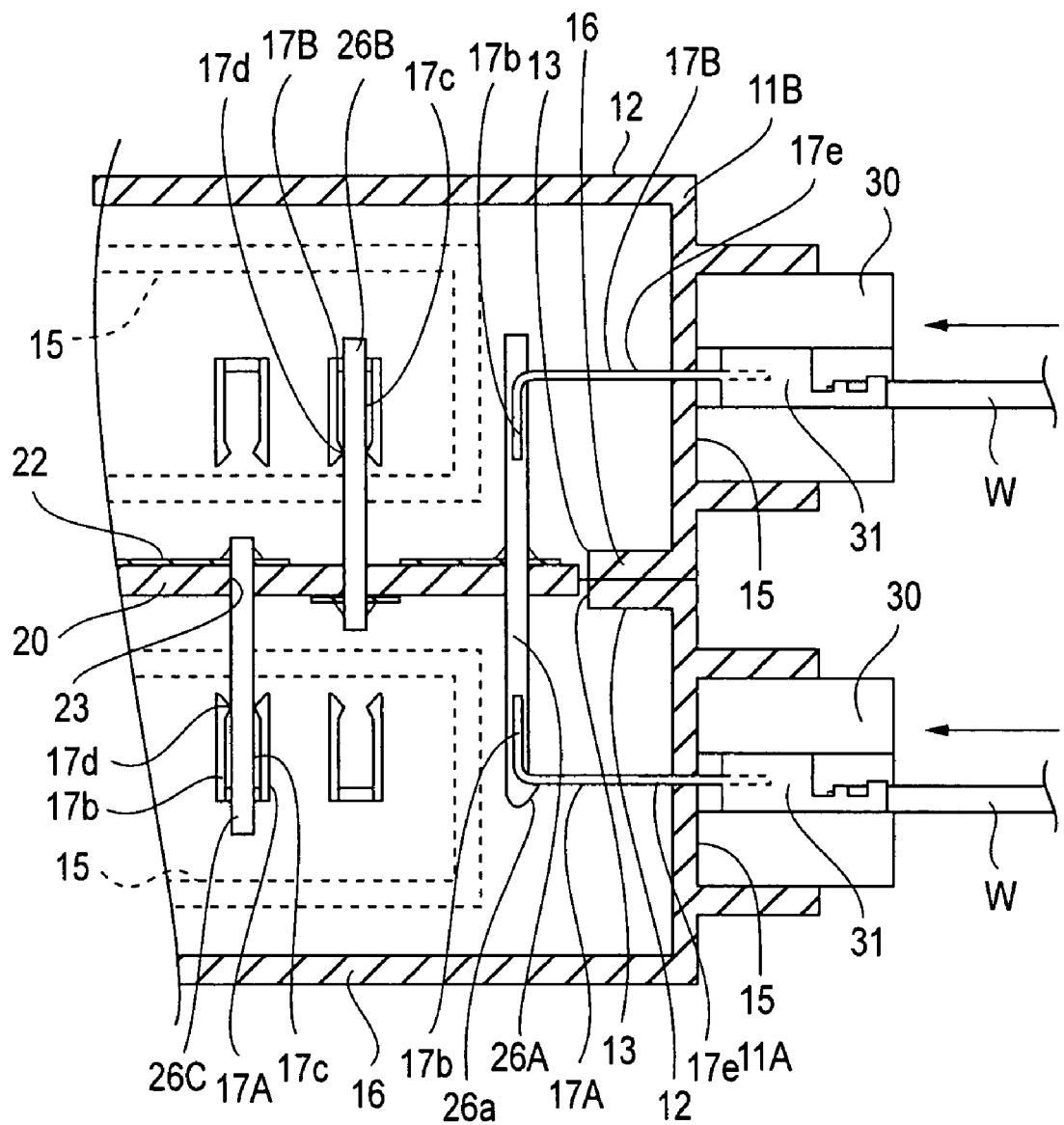
FIG. 11 is a cross-sectional view of an electric junction box according to a third embodiment of the present invention.
Figure 12A:
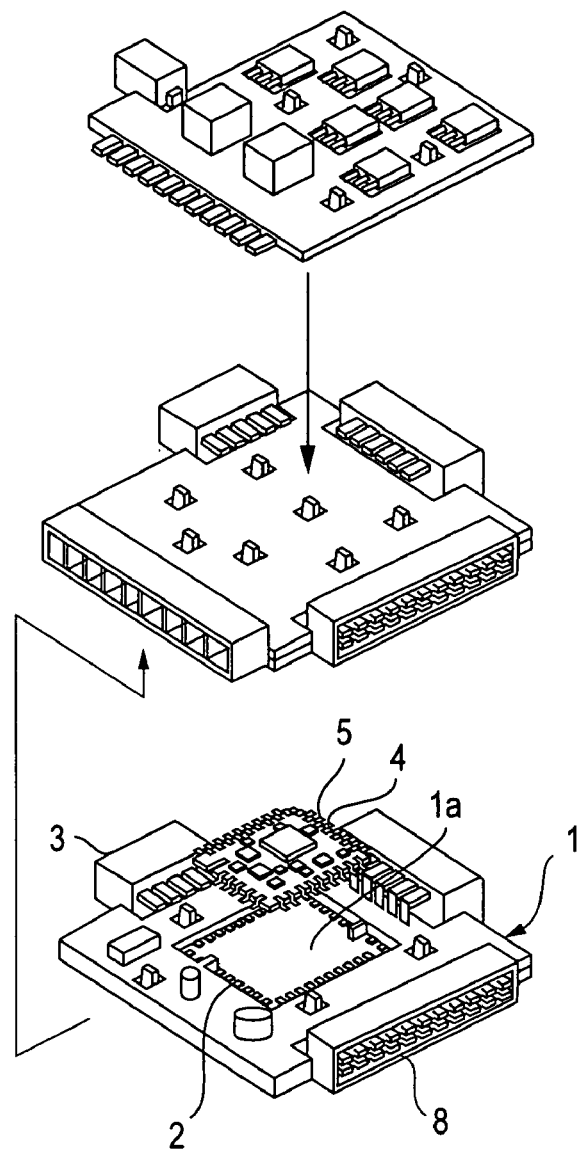
FIGS. 12A and B show a prior art electric junction box.
Figure 12B:
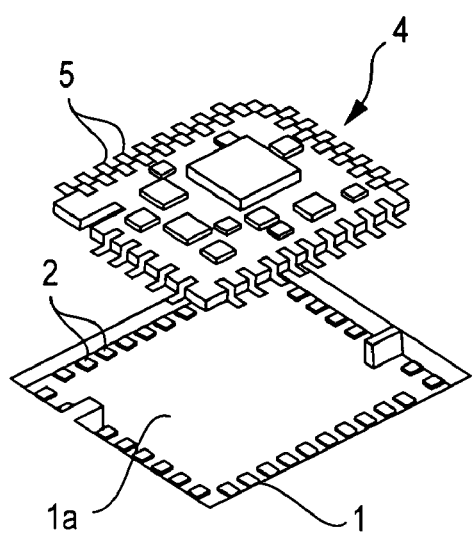

FIG. 11 illustrates the third embodiment of the present invention. The third embodiment of the present invention includes case 11A, 11B that are laminated in a stacked configuration to sandwich printed-circuit board 20. Laminated cases 11A and 11B have the same configuration as the cases describe in the first embodiment. Case 11A on the lower level is positioned in such a way as to form opening 13 on the upper side 12; case 11B on the upper level is positioned upside down in such a way as to form opening 13 on the lower side 16. Accordingly, terminal 17A attached to case 11 on the lower level has one end 17b projecting upward; terminal 17B attached to case 11B on the upper level that is positioned upside down has one end 17b projecting downward.

Printed-circuit board 20 has three kinds of connection pins attached. The first connection pin 26A is a long sheet that projects from the printed-circuit board both upward and downward, with the approximate central region in an axis direction welded to conductor 22 of printed-circuit board 20. The first connection pin 26A has locking claw 26a only on one end so that it can pass through terminal hole 23 of printed-circuit board 20. The second connection pin 26B has a structure identical to that of the pin described in the first embodiment and projects upward from printed-circuit board 20. The third connection pin 26C also has a structure identical to that of the pin described in the first embodiment but projects downwardly from printed-circuit board 20.

As described above, cases 11A and 11B are laminated to sandwich printed-circuit board 20, and printed-circuit board 20 is positioned at opening 13 of cases 11A and 11B. This configuration connects the lower-side tip of the first connection pin 26A with terminal 17A attached to case 11A on the lower level; while connecting the upper-side tip of the first connection pin 26A with terminal 17B attached to case 11B on the upper level. At the same time, the second connection pin 26B connects to terminal 17B of case 11B, while the third connection pin 26C connects to terminal 17A of case 11A.

According to the above-noted embodiment, positioning case 11 in a stacked configuration enables more complex circuit patterns, thus making it possible to connect more electric wires "w" using the same case 11. Moreover, it is possible to use a case with openings on the upper and lower side described in the second embodiment instead of the case described in the fist embodiment. Laminated cases are not limited to a two-tier structure but can be in three or more tiers. Furthermore, although the present embodiment uses one printed-circuit board sandwiched between cases, it is also possible to use layered printed-circuit boards that can accommodate more complex circuit patterns. Other components and effects are identical to those described in the first embodiment, and their illustration is therefore omitted with the same numbers assigned.

Figure 13:
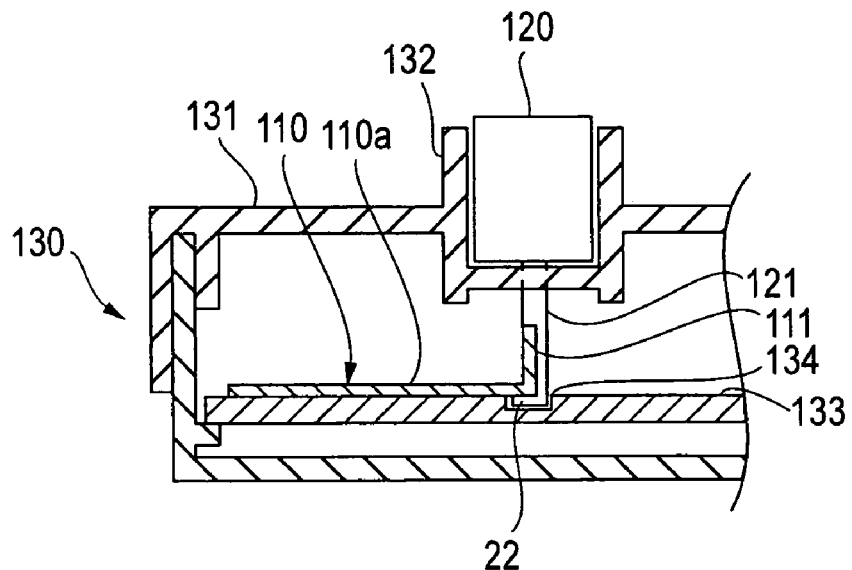
FIG. 13 is a cross-sectional view of a connection structure of a tuning-fork terminal and a mating terminal according to a fourth embodiment of the present invention.
Figure 14:
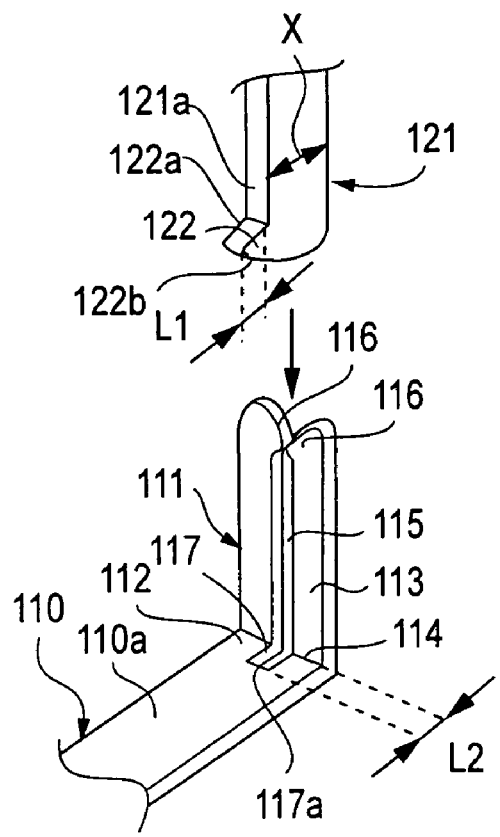
FIG. 14 is an exploded perspective view of a portion of the connection structure of the embodiment of FIG. 13 illustrating the tuning-fork terminal and the mating terminal.
Figure 15:
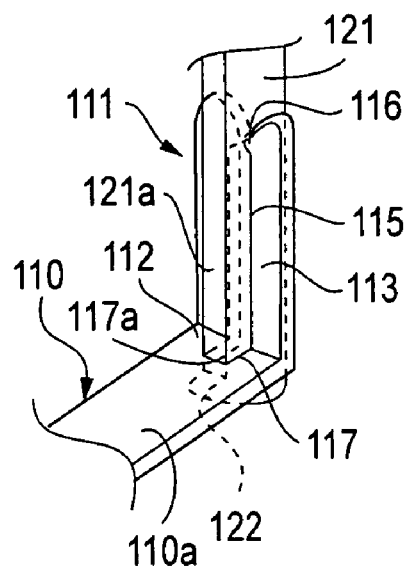
FIG. 15 is a perspective view of a portion of the connection structure of the embodiment of FIG. 13 illustrating a connection structure of the tuning-fork terminal and the mating terminal shown.

FIGS. 13, 14, and 15 illustrate a connection structure of tuning-fork terminal 111 according to the fourth embodiment of the present invention. Tuning-fork terminal 111 is provided at the end of bus bar 110 (conducting plate) housed in electric connection box 130 and connected to relay terminal 121 of relay 120 fitted into relay mount 132 formed on upper wall 131 of electric connection box 130.

In particular, tuning-fork terminal 111 is formed at the end portion of base 110a of bus bar 110 bent vertically as shown in FIG. 14, including horizontal portion 112 on the same surface of base 110a of bus bar 110 and vertical portion 113 that continues from horizontal portion 112 through bend 114. Vertical portion 113 has press connection slot or crimping slot 115 vertically notched from the center of the end to bend 114 and contact portions 116 projecting from both inner sides of slot 115 and directed toward each other. Horizontal portion 112 has latching hole 117 horizontally notched from bend 114 toward base 110a of bus bar 110 and continuing from slot 115.

Relay terminal 121 is a tab-shaped flat plate, having at the insertion end latching tab 122 projecting to one side in the direction of plate width X of terminal 121. Projection dimension L1 of latching tab 122 is one-half of plate width X. Latching tab 122 has plane upper surface 122a in the drawing, projecting from side end 121a in the perpendicular direction, and tapered lower surface 122b.

Notch depth L2 from bend 114 of latching hole 117 of tuning-fork terminal 111 is less than projection dimension L1 of latching tab 122 of relay terminal 121.

Bus bar 110 is fixed onto the top surface of insulating plate 133, which has cavity 134 on the top surface above which tuning-fork terminal 111 is located as shown in FIG. 13.

To connect tuning-fork terminal 111 with relay terminal 121, relay terminal 121 is first inserted from the upper end of tuning-fork terminal 111 into slot 115 and latching hole 117, and then latching tab 122 of relay terminal 121 is pressed into cavity 134 underneath horizontal portion 112 of tuning-fork terminal 111. Next, side end 121a of relay terminal 121 is pressed against back end 117a of latching hole 117 of tuning-fork terminal 111, so that latching tab 122 projects further toward base 110a of bus bar 110 than latching hole 117 as shown in FIGS. 13 and 15. Then, a pair of contact portions 116 of tuning-fork terminal 111 is crimped to both sides of relay terminal 121 and electrically connected. At the same time, latching tab 122 of relay terminal 121 locks into the rear side of base 110a of bus bar 110, that is, the rear side of horizontal portion 112 of tuning-fork terminal 111.

According to the connection structure described above, slot 115 of tuning-fork terminal 111 is extended and bent to form latching hole 117 and latching tab 122 is formed to project at the end of relay terminal 121. Therefore, respective connection structures of tuning-fork terminal 111 and relay terminal 121 provide the locking mechanism. The simple terminal shape and locking mechanism also achieve an inexpensive structure that prevents disengagement of terminals. Furthermore, simplicity of locking and unlocking work offers good workability in attaching and detaching a relay.

Moreover, projection dimension L1 of latching tab 122 of one-half plate width X of relay terminal 121 allows contact portions 116 of tuning-fork terminal 111 to be crimped to a rough center position in the width direction of relay terminal 121, thereby ensuring stable contact. Limiting the projection within a required dimension also reduces a working space required for locking latching tab 122 into horizontal portion 112 of tuning-fork terminal 111. Since notch depth L2 of latching hole 117 is less than projection dimension L1 of latching tab 122, latching tab 122 stays locked into horizontal portion 112 of tuning-fork terminal 111 whenever relay terminal 121 contacts contact portions 116 of tuning-fork terminal 111.

Figure 16:
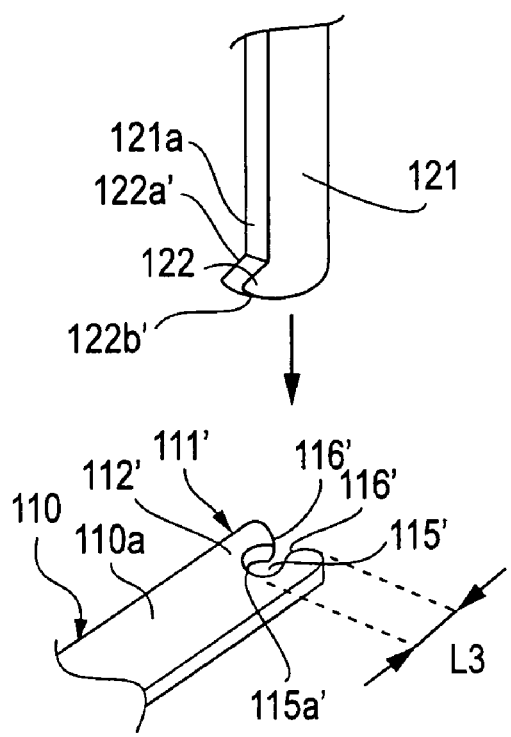
FIG. 16 is an exploded perspective view of a portion of a connection structure illustrating a tuning-fork terminal and a mating terminal according to a fifth embodiment of the present invention.
Figure 17:
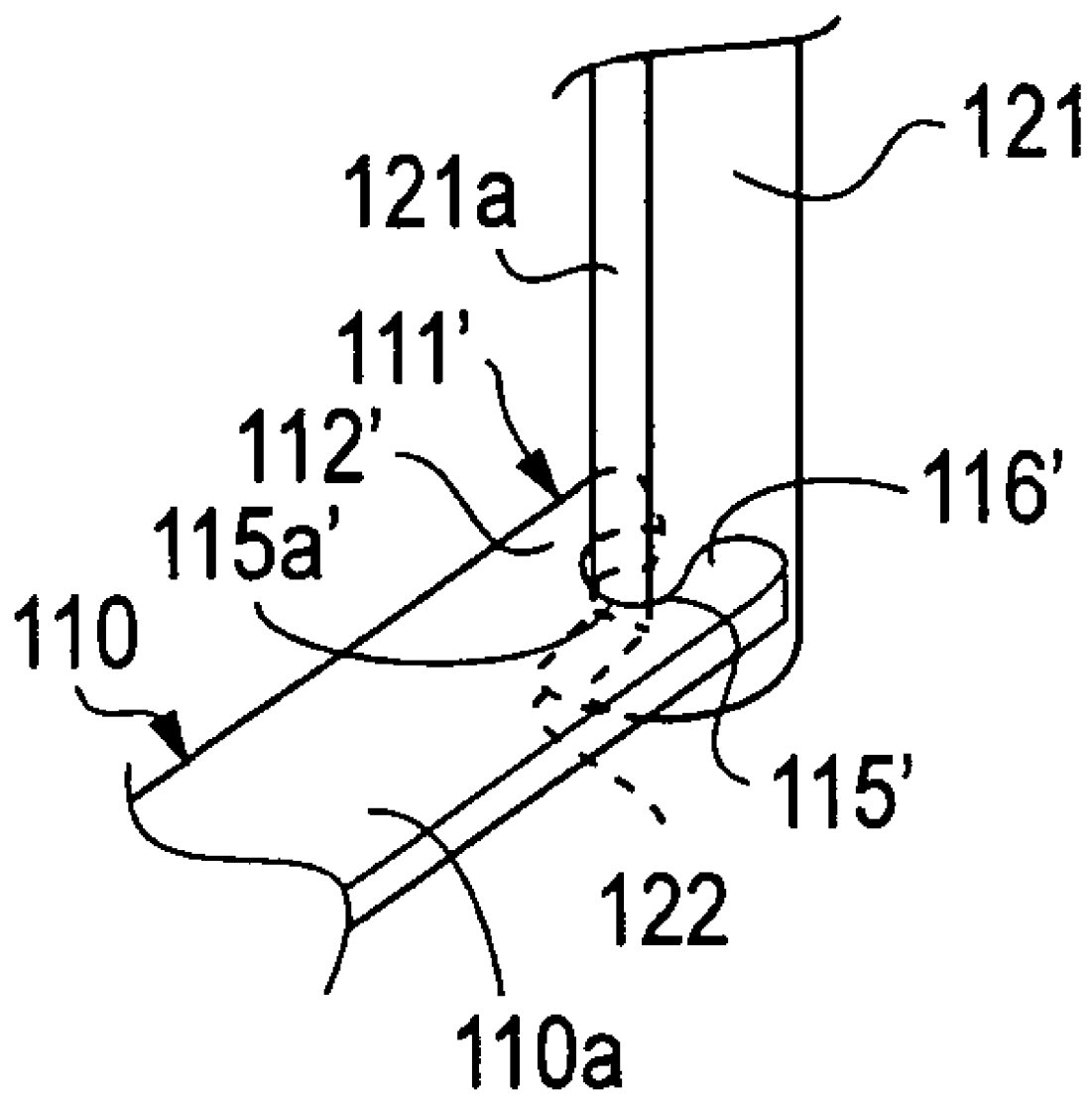
FIG. 17 is a perspective view of a portion of the connection structure of the embodiment of FIG. 16 illustrating the connection structure of the tuning-fork terminal and the mating terminal.
Figure 18:
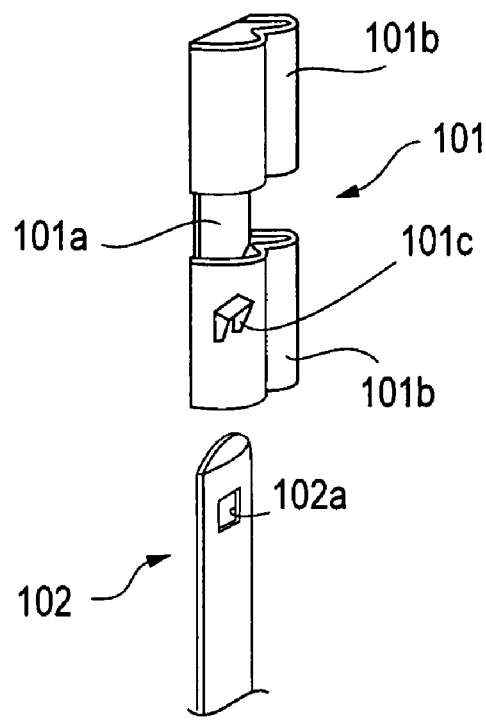
FIG. 18 illustrates a conventional example.
Figure 19:
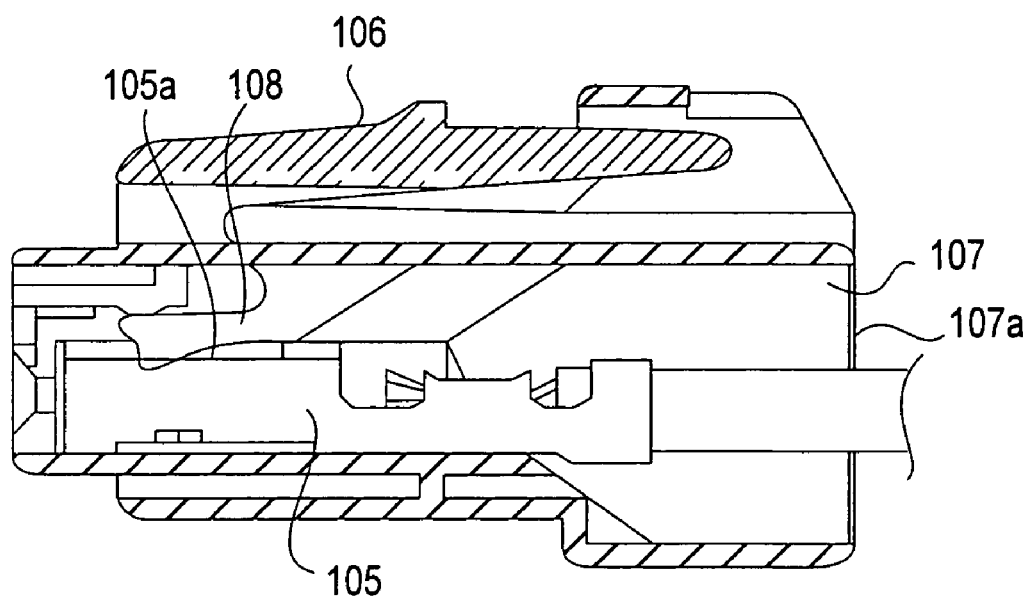
FIG. 19 is a cross-sectional view of another conventional example.

FIGS. 16 and 17 illustrate a connection structure of tuning-fork terminal 111' according to the fifth embodiment of the present invention. The fifth embodiment is different from the fourth embodiment in forming horizontal tuning-fork terminal 111' having no bend.

Tuning-fork terminal 111' is formed at the end portion of bus bar 110, consisting of base 110a of bus bar 110 and horizontal portion 112' on the same surface. Horizontal portion 112' has slot 115' horizontally notched from the end and a pair of contact portions 116' projecting from both inner sides of slot 115'. Dimension L3 from contact portions 116' to back end 115a' of slot 115' is less than projection dimension L1 of latching tab 122' of relay terminal 121, the mating terminal. Upper and lower surfaces 122a' and 122b' of latching tab 122 are tapered.

To connect relay terminal 121 to tuning-fork terminal 111', relay terminal 121 is inserted into slot 115' of tuning-fork terminal 111' in the orthogonal direction as shown in FIG. 16. When latching tab 122 projects below tuning-fork terminal 111', side end 121a of relay terminal 121 is pressed against back end 115a' of slot 115'. Then, contact portions 116' of tuning-fork terminal 111' are crimped to both sides of relay terminal 121 and electrically connected. At the same time, latching tab 122 locks into the rear side of base 110a of bus bar 110 and engages the terminals.

According to the connection structure described above, tuning-fork terminal 111' can be formed short, thus improving the strength of tuning-fork terminal 111' and preventing deformation. Proximity of locking and connecting portions of tuning-fork terminal 111' and relay terminal 121 further ensures continuation of electrical connection even when one of tuning-fork terminal 111' and relay terminal 121 deforms.

The present invention is not limited to the above-described embodiments. Other than the relay terminal, a mating terminal may, for example, be one of a fuse terminal, a junction terminal and a terminal connected to an external circuit.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electric junction box comprising:
   a printed-circuit board including a conductor formed on a circuit board, said printed-circuit board having a plurality of connection pins projecting outwardly therefrom at intervals along a peripheral edge of said printed-circuit board, said plurality of connection pins connected to said conductor of said printed-circuit board; and
   a case including an opening corresponding to said printed-circuit board in a central region of at least an upper surface or a lower surface of said case, said case including a plurality of peripheral walls and having a connector joint on at least one of said peripheral walls, said case having a plurality of L-shaped terminals provided along an inner peripheral edge of said opening at intervals substantially equal to said intervals between said plurality of connection pins;
   wherein, a first end of each said L-shaped terminal projects from said peripheral edge in said opening of said case; each said first end including a press connection slot formed therein, and a second end of each said L-shaped terminal projects outwardly from a terminal hole of one of said at least one connector joint; and
   wherein said printed-circuit board is positioned to close said opening in said case; and each said connection pin is inserted into and connected to a respective press-connecting slot of a respective L-shaped terminal.

2. The electric junction box according to claim 1, further comprising:
   a second printed-circuit board;
   wherein said case includes an opening on each of said upper and lower surfaces of said case, a plurality of said L-shaped terminals attached along an inner peripheral edge of each of said upper and lower openings, a first end of each L-shaped terminal connected to a connection pin of one of said printed-circuit boards and a second end of each L-shaped terminal projects outwardly from said terminal-hole of said at least one connector joint.

3. The electric junction box according to claim 1, wherein said connection pins connected to said conductor of said printed-circuit board project upwardly from an upper side of said printed circuit board and downwardly from a lower side of said printed-circuit board, said case comprising a first case, said electric junction box further comprising:
   a second case stacked vertically on said first case and sandwiching said printed-circuit board;
   wherein said connection pins projecting upwardly and downwardly from said upper and lower sides of said printed-circuit board are inserted into facing press-connecting slots of said L-shaped terminals of the vertically stacked cases.

4. The electric junction box according to claim 3, wherein said connections include three types of connection pins comprising first connection pins projecting upwardly from said upper side of said printed-circuit board and downwardly from said lower side of said printed-circuit board, second connection pins projecting upwardly, and third connection pins projecting downwardly.

5. The electric junction box according to claim 1, wherein said connection pins connected to said conductor of said printed-circuit board are one of inserted into terminal holes formed on said conductor and soldered to said conductor and provided as press fit terminals press-fitted into said terminal holes.

6. The electric junction box according to claim 1, wherein said conductor of said printed-circuit board is one of formed according to a circuit pattern, and first formed grid-shaped and then a circuit pattern is formed by removing necessary portions; and electric and/or electronic components are mounted on said printed-circuit board.

7. The electric junction box according to claim 1, wherein said printed-circuit board has a square shape, and said opening in said case has a corresponding square shape, said square shaped printed-circuit board positioned to close said square shaped opening.

8. The electric junction box according to claim 1, where said case includes four peripheral walls and a connector joint provided on each of said four peripheral walls.

9. The electric junction box according to claim 1, each said L-shaped terminal is attached along an inner peripheral edge of said opening.

10. The electric junction box according to claim 1, wherein said printed-circuit board includes connection pins projecting outwardly therefrom at intervals along the entire peripheral edge of said printed-circuit board, and said case includes corresponding L-shaped terminals provided along the entire inner peripheral edge said opening.

11. The electric junction box according to claim 1, wherein each said connection pin includes a latching tab projecting from a side of the insertion end of connection pin;
   said slot of said L-shaped terminal extends to a bend in said L-shaped terminal and said L-shaped terminal includes a latching portion cut into a base thereof and extending from said slot; and
   said connection pin is inserted into said press connection slot and said latching portion, locking said latching tab onto a rear side of said base.

12. The electric junction box according to claim 11, wherein the depth of said latching portion from said bend is smaller than the projection dimension of said latching tab of said connection pin.

13. The electric junction box according to claim 11, wherein the projection dimension of said latching tab of said connection pin equals substantially one half the width in the projection direction of said connection pin.

* * * * *